United States Patent
Choi et al.

(10) Patent No.: US 10,685,762 B2
(45) Date of Patent: Jun. 16, 2020

(54) PASTE FOR OHMIC CONTACT TO P-TYPE SEMICONDUCTOR AND METHOD FOR FORMING OHMIC CONTACT TO P-TYPE SEMICONDUCTOR USING THE SAME

(71) Applicant: KOREA INSTITUTE OF SCIENCE AND TECHNOLOGY, Seoul (KR)

(72) Inventors: Ji-Won Choi, Seoul (KR); Jin Sang Kim, Seoul (KR); Chong Yun Kang, Seoul (KR); Seong Keun Kim, Seoul (KR); Seung Hyub Baek, Seoul (KR); Sang Tae Kim, Seoul (KR); Won Jae Lee, Seosan-si (KR); Narendra Singh Parmar, Seoul (KR); Young-Shin Lee, Seoul (KR)

(73) Assignee: KOREA INSTITUTE OF SCIENCE AND TECHNOLOGY, Seoul (KR)

( * ) Notice: Subject to any disclaimer, the term of this patent is extended or adjusted under 35 U.S.C. 154(b) by 0 days.

(21) Appl. No.: 15/990,824

(22) Filed: May 29, 2018

(65) Prior Publication Data

US 2018/0358146 A1     Dec. 13, 2018

(30) Foreign Application Priority Data

Jun. 13, 2017  (KR) .................. 10-2017-0073908

(51) Int. Cl.
*H01B 1/22* (2006.01)
*H01L 29/20* (2006.01)
(Continued)

(52) U.S. Cl.
CPC .............. *H01B 1/22* (2013.01); *H01L 21/288* (2013.01); *H01L 21/28512* (2013.01);
(Continued)

(58) Field of Classification Search
CPC ................... H01L 21/288; C08L 29/04; C08K 2003/2255; C08K 2201/001
See application file for complete search history.

(56) References Cited

U.S. PATENT DOCUMENTS 5,756,207 A * 5/1998 Clough ............. C04B 35/62847
428/375
6,319,808 B1 * 11/2001 Ho ......................... H01L 33/40
438/597
(Continued)

FOREIGN PATENT DOCUMENTS

EP    1863327 A1    12/2007
JP    5218470 A      8/1993
(Continued)

OTHER PUBLICATIONS

Herbert B. Michaelson, "The work function of the elements and its periodicity," Journal of Applied Physics, Nov. 1977, pp. 4729-4733, vol. 48, No. 11, American Institute of Physics.
(Continued)

*Primary Examiner* — William F Kraig
*Assistant Examiner* — Khatib A Rahman
(74) *Attorney, Agent, or Firm* — Cantor Colburn LLP (57) ABSTRACT

The present disclosure relates to a paste for ohmic contact to p-type semiconductor, including a metal oxide and a binder, wherein the metal oxide is a rhenium oxide or a molybdenum oxide.

10 Claims, 8 Drawing Sheets

(51) Int. Cl.
*H01L 21/288* (2006.01)
*H01L 21/285* (2006.01)
*H01L 29/45* (2006.01)
*C08L 29/04* (2006.01)
*C08K 3/22* (2006.01)

(52) U.S. Cl.
CPC .... *H01L 21/28575* (2013.01); *H01L 29/2003* (2013.01); *H01L 29/452* (2013.01); *C08K 2003/2255* (2013.01); *C08K 2201/001* (2013.01); *C08L 29/04* (2013.01)

(56) References Cited

U.S. PATENT DOCUMENTS

| | | | |
|---|---|---|---|
| 7,081,401 B2* | 7/2006 | Lee | H01L 33/40 257/E21.172 |
| 7,687,908 B2* | 3/2010 | Leem | H01L 21/28575 257/615 |
| 8,088,993 B2* | 1/2012 | Akimoto | H01B 1/16 136/256 |
| 8,164,088 B2 | 4/2012 | Ohsawa et al. | |
| 8,742,407 B2 | 6/2014 | Ohsawa et al. | |
| 8,946,698 B2 | 2/2015 | Ohsawa et al. | |
| 2004/0112945 A1* | 6/2004 | Wolfgram | B23K 35/3006 228/245 |
| 2010/0059790 A1* | 3/2010 | Takeuchi | B82Y 20/00 257/103 |
| 2011/0169138 A1* | 7/2011 | Lin | H01L 21/02389 257/615 |
| 2011/0174377 A1* | 7/2011 | Lee | H01L 31/03046 136/262 |
| 2012/0003711 A1* | 1/2012 | Tseng | B01L 3/502707 435/177 |
| 2013/0140517 A1* | 6/2013 | Tang | H01L 21/6836 257/9 |
| 2013/0330539 A1* | 12/2013 | Ha | C01B 25/372 428/328 |
| 2016/0163895 A1* | 6/2016 | Yeh | C09D 5/24 136/256 |
| 2016/0369111 A1* | 12/2016 | Moyer | C09D 5/24 |
| 2017/0135208 A1 | 5/2017 | Jung et al. | |

FOREIGN PATENT DOCUMENTS

| | | |
|---|---|---|
| JP | 2004192853 A | 7/2004 |
| JP | 2007500661 A | 1/2007 |
| JP | 201646309 A | 4/2016 |
| KR | 1020050025210 A | 3/2005 |
| KR | 100515652 B1 | 9/2005 |
| KR | 101278976 B1 | 7/2013 |
| KR | 1020170053462 A | 5/2017 |
| WO | 2005040044 A2 | 5/2005 |
| WO | 2006100790 A1 | 9/2006 |

OTHER PUBLICATIONS

N. S. Parmar et al., "Sodium doping in ZnO crystals," Applied Physics Letters, 2015, p. 022101-1-022101-3, vol. 106, AIP Publishing LLC.

Violet M. Poole et al., "P-type conductivity in annealed strontium titanate," AIP Advances, 2015, pp. 127217-1 127217-4, vol. 5.

* cited by examiner

FIG. 7

PASTE FOR OHMIC CONTACT TO P-TYPE SEMICONDUCTOR AND METHOD FOR FORMING OHMIC CONTACT TO P-TYPE SEMICONDUCTOR USING THE SAME

CROSS-REFERENCE TO RELATED APPLICATION

This application claims priority to Korean Patent Application No. 10-2017-0073908, filed on Jun. 13, 2017, and all the benefits accruing therefrom under 35 U.S.C. § 119, the contents of which in its entirety are herein incorporated by reference.

BACKGROUND

1. Field

The present disclosure relates to a paste for ohmic contact to p-type semiconductor and a method for forming ohmic contact to p-type semiconductor using the same, and more particularly, to a paste for ohmic contact to p-type semiconductor, including a metal oxide and a binder, and a method for forming ohmic contact to p-type semiconductor using the same.

2. Description of the Related Art

Ohmic contacts to p-type semiconductor materials are an essential premise for manufacture of devices in a wide range of applications such as solar cells, light-emitting diodes (LEDs), transistors and laser diodes. However, p-type semiconductor materials have higher work function than available contact metals on Earth, and thus they are difficult to form ohmic contacts.

For example, many noble metals such as Pt (5.65 eV) and Au (5.1 eV) have a relatively high work function, but they are insufficient to form ohmic contacts by removal of Schottky barriers to semiconductors having a wide energy bandgap such as GaN and ZnO.

Meanwhile, some attempts have been made to overcome these problems by using metals with high work function, and through doping and formation of semiconductor-metal alloys. These attempts succeeded in achieving ohmic contacts, but the forming process is complex. For example, to form contact to p-type Si using Al, it requires a high temperature process that is higher than the melting temperature 577° C.

As alternative materials, it was reported that metal oxide such as molybdenum (Mo), rhenium (Re) and tungsten (W) oxide exhibits high work function (higher than 6 eV) and electrical conductivity. Metal trioxide materials such as $MoO_3$ and $ReO_3$ have been formed and used as a buffer layer to improve the power conversion efficiency in organic solar cells through thermal evaporation.

Recently, it is possible to form ohmic contact to p-type semiconductor having a wide energy bandgap using metal oxide such as $MoO_2$ and $ReO_2$ through a vacuum process, but the contact is weak and heat treatment of 200° C. or above is needed.

RELATED LITERATURES (Patent Literature 1) Korean Patent Publication No. 10-2005-0025210

(Patent Literature 2) Japanese Patent Publication No. 2004-192853

SUMMARY

Figure 7:
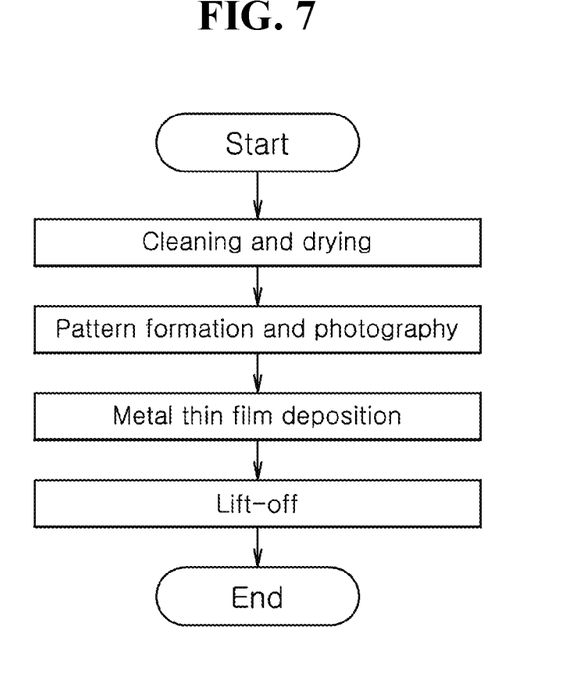
FIG. 7 shows a method for forming ohmic contact to p-type semiconductor according to the related art.

For example, a method for forming ohmic contact disclosed by Patent Literature 1 needs deposition of Mo or Re metal by a physical vapor deposition or a chemical vapor deposition method, and as shown in FIG. 7, additional heat treatment at 600° C. in oxidizing atmosphere. Accordingly, the process is very complex, and it cannot be applied to PET or PI substrates vulnerable to heat treatment of 600° C.

Additionally, a conductive paste disclosed by Patent Literature 2 is nothing but a conductive paste that is necessary at high temperature, and is irrelevant to formation of ohmic contact to p-type semiconductor.

Accordingly, until now, there is a limitation in obtaining ohmic contacts due to higher work function of p-type semiconductor materials than available contact metals on Earth, and in this circumstance, there is a need for the technology development of p-type semiconductors having a wide energy bandgap in next-generation devices using $MoO_2$ and $ReO_2$ with high work function through non-vacuum and non-thermal process and their related flexible devices.

Accordingly, the present disclosure proposes a method for obtaining excellent ohmic contacts to p-type semiconductor using metal oxide with high work function such as $MoO_2$ and $ReO_2$ without a vacuum process or a thermal process.

To achieve the above-described technical object, the present disclosure provides a paste for ohmic contact to p-type semiconductor, including a metal oxide and a binder, wherein the metal oxide is a rhenium oxide or a molybdenum oxide.

Additionally, the rhenium oxide of the present disclosure may include at least one selected from $Re_2O$, $Re_2O_3$, $ReO_2$, $ReO_3$ and $Re_2O_7$, and the molybdenum oxide may include at least one selected from $Mo_2O$, $Mo_2O_3$, $MoO_2$, $MoO_3$ and $Mo_2O_7$.

Additionally, there may be provided the paste for ohmic contact to p-type semiconductor wherein the binder of the present disclosure is an inorganic or organic polymer compound.

Additionally, the organic polymer compound of the present disclosure may include at least one selected from a vinyl-based polymer compound, a polyamide-based polymer compound and a polyurethane-based polymer compound.

Additionally, there may be provided the paste for ohmic contact to p-type semiconductor wherein the vinyl-based polymer compound of the present disclosure is polyvinylalcohol.

Additionally, the polyvinylalcohol of the present disclosure may be present in an amount ranging between 0.03 and 0.15 mL, and when the rhenium oxide is $ReO_2$, the binder may include 0.15 mL of polyvinylalcohol, and when the molybdenum oxide is $MoO_2$, the binder may include 0.10 mL of polyvinylalcohol.

Additionally, the present disclosure provides a method for forming ohmic contact to p-type semiconductor, including applying the above-described paste to a substrate, drying the substrate, and performing surface treatment of the substrate.

Additionally, the performing surface treatment of the substrate of the present disclosure may include immersing in a solvent and boiling aqua regia.

Additionally, the substrate of the present disclosure may be a GaN substrate, and the GaN substrate may be flexible.

The present disclosure provides the $MoO_2$ and $ReO_2$ paste by a simple process with no need of a variety of vacuum deposition methods (chemical vapor deposition, physical vapor deposition and sputtering methods) for deposition of Mo or Re to form $MoO_2$ and $ReO_2$ and heat treatment of 200° C. or above to form oxide of deposited Mo or Re as in the related art.

Additionally, through the $MoO_2$ and $ReO_2$ paste of the present disclosure, there is provided a method for forming ohmic contact to p-type semiconductor by a simple process and with the minimized exposure to heat, and which can be used in the applications of organic solar cells and vulnerable devices and various flexible substrates such as polyethylene terephthalate (PET).

DETAILED DESCRIPTION

Hereinafter, a paste for ohmic contact to p-type semiconductor according to the present disclosure and a method for forming ohmic contact to p-type semiconductor using the same will be described through the preferred embodiments of the present disclosure on the basis of the accompanying drawings.

Prior to the description, in many embodiments, elements with the same configuration will be representatively described in an embodiment using the same symbol, and in the other embodiments, only different elements will be described.

Figure 1:
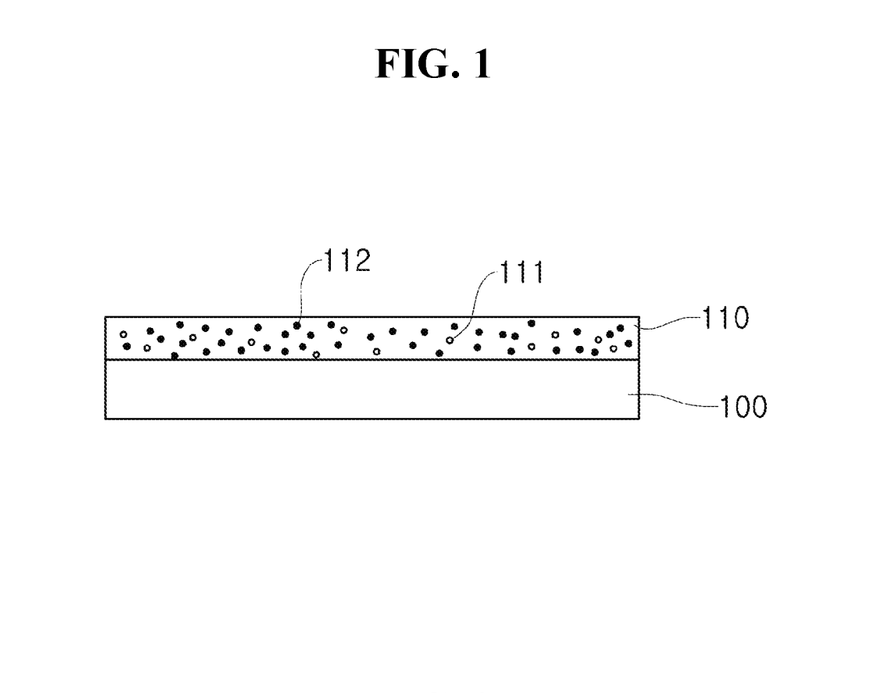
FIG. 1 is a diagram of a substrate and a paste for ohmic contact to p-type semiconductor according to an embodiment of the present disclosure.

FIG. 1 is a diagram of a substrate 100 and a paste 110 for ohmic contact to p-type semiconductor according to an embodiment of the present disclosure.

As shown in FIG. 1, in the paste 110 material for forming ohmic contact, the present disclosure uses a metal oxide 111 and a binder 112. Specifically, for the metal oxide 111, rhenium (Re) or molybdenum (Mo) oxide is used.

The rhenium oxide may be used as a material for forming ohmic contact to p-type semiconductor including at least one type of material selected from $Re_2O$, $Re_2O_3$, $ReO_2$, $ReO_3$ and $Re_2O_7$.

Additionally, the molybdenum oxide may be used as a material for forming ohmic contact to p-type semiconductor including at least one type of material selected from $Mo_2O$, $Mo_2O_3$, $MoO_2$, $MoO_3$ and $Mo_2O_7$.

Additionally, for the binder 112, an inorganic or organic polymer compound may be used, and the organic polymer compound may include at least one selected from a vinyl-based polymer compound, a polyamide-based polymer compound and a polyurethane-based polymer compound. Particularly, for the vinyl-based polymer compound, it is preferred to use polyvinylalcohol (PVA).

The application of the paste 110 using the rhenium or molybdenum oxide and the binder to the substrate 100, followed by treatment of the substrate 100, may greatly improve the ohmic contact characteristics.

Figure 2:
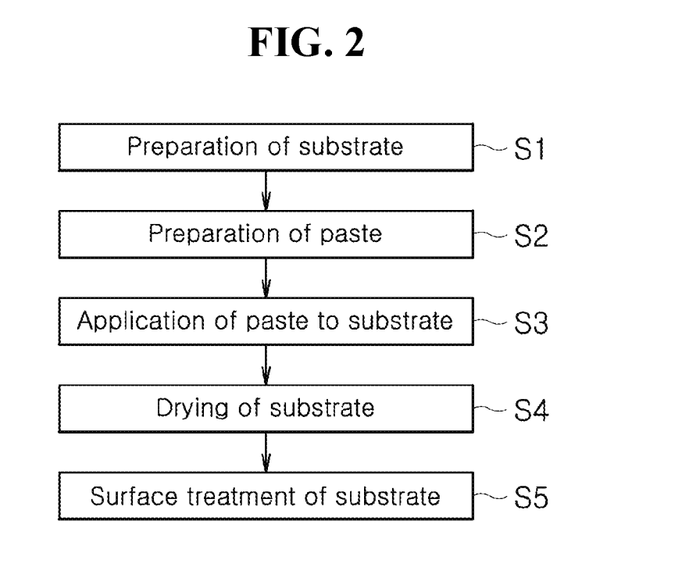
FIG. 2 is a diagram showing each step of a method for forming ohmic contact to p-type semiconductor according to an embodiment of the present disclosure.

FIG. 2 is a diagram showing each step of a method for forming ohmic contact to p-type semiconductor according to an embodiment of the present disclosure.

As shown in FIG. 2, all substrates (glass, Si and GaN) are cleaned with a general solvent and prepared (S1), and the Si substrate is immersed in 10% dilute HF before deposition. Metal oxide powder 111 and 5 wt % of PVA are mixed on the substrates patterned with Kapton tape (S2), applied to the substrate 100 (S3), and dried in the air (S4).

To improve the ohmic contact characteristics, surface treatment (S5) for oxide removal from the GaN substrate is each performed using a buffered oxide etch (BOE) and boiling aqua regia ($HNO_3$:HCl=1:3) for 10 minutes and 20 minutes.

Additionally, specific contact resistance characteristics on p-type Si are investigated using an optimized metal oxide mixture evaluated by electrical resistivity of the p-type semiconductor and contact state on the substrate. Additionally, to investigate Schottky barrier characteristics, metal oxide n-type silicon Schottky barrier diodes are fabricated.

Figure 3:
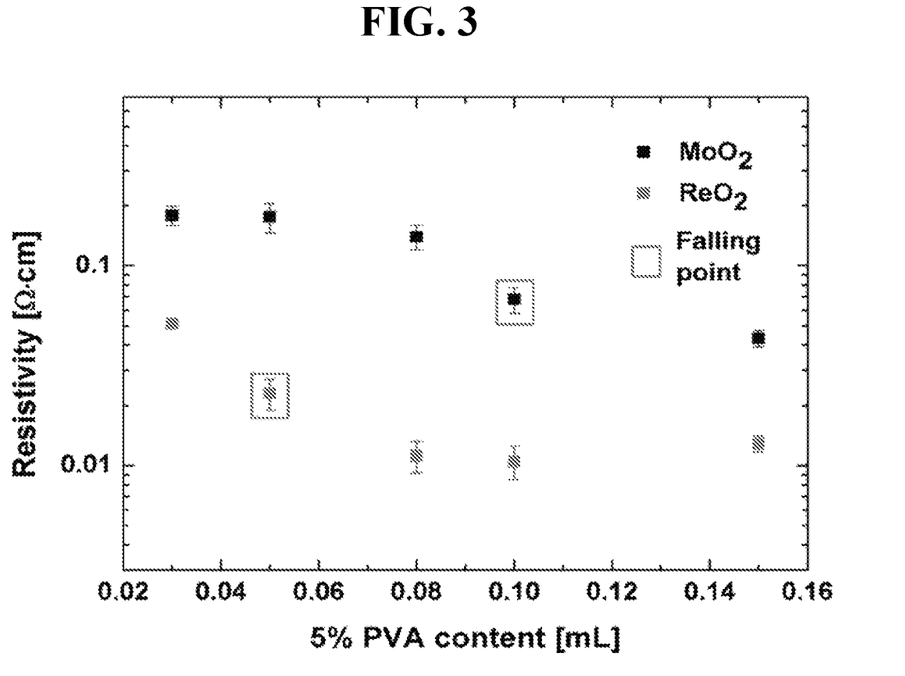
FIG. 3 shows electrical resistance characteristics of metal oxide $MoO_2$ and $ReO_2$ as a function of PVA content according to an embodiment of the present disclosure.

FIG. 3 shows electrical resistance characteristics of metal oxide $MoO_2$ and $ReO_2$ as a function of PVA content according to an embodiment of the present disclosure.

As shown in FIG. 3, when the mixture of 5 wt % of PVA and metal oxide is applied to the glass substrate, electrical resistance is measured by Hall effect measurements as a function of PVA content in 30 mg of metal oxide powder.

Specifically, it can be seen that $ReO_2$ has lower resistance than $MoO_2$, and the electrical resistance reduces with the increasing PVA content irrespective of metal oxide. Additionally, as the PVA content is lower, the bond strength of powder is lower and the resistance is higher, causing a contact problem of a probe tip.

Meanwhile, an amount of binder in the mixture is very important because it may change the characteristics of metal oxide powder. Accordingly, a minimum amount of PVA for strongly binding the oxide powder is optimized. The optimized minimum amount of binder is evaluated by resistivity of the mixture and contact state on the substrate.

Because the density of $MoO_2$ and $ReO_2$ (6.47 and 11.4 g/cm$^3$ respectively) is different, the resistivity of the metal oxide mixture starts to reduce at different points, and at the point where the resistivity falls (in FIG. 1, where an amount of PVA in $MoO_2$ is 0.1 mL and an amount of PVA in $ReO_2$ is 0.05 mL), PVA in similar amounts is mixed in the same volume. The resistivity of the optimized mixture is 0.067.8±0.01 Ω·cm and 0.023±0.004 Ω·cm in $MoO_2$ and $ReO_2$ respectively.

Figure 4A:
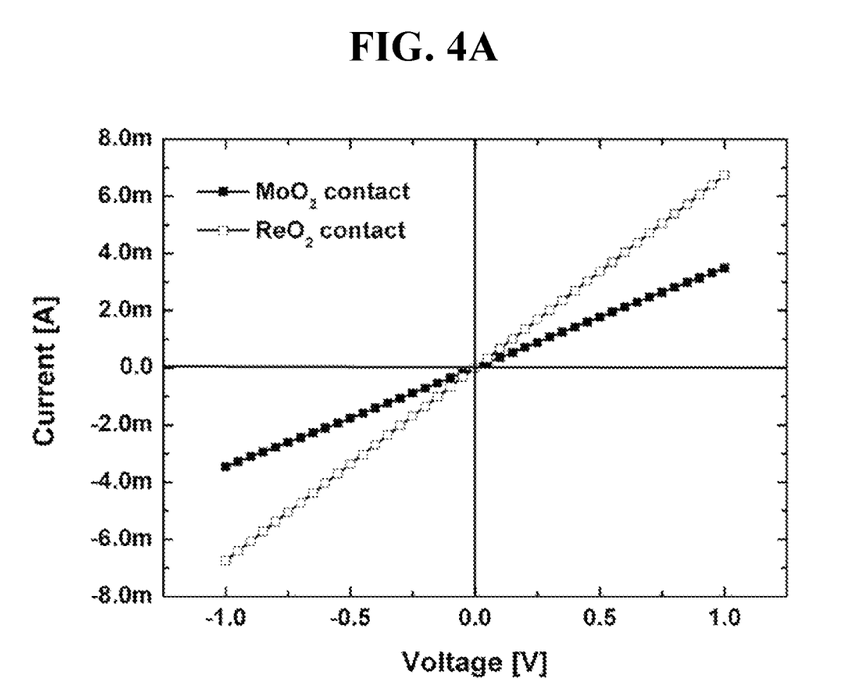
FIG. 4A shows linear I-V characteristics of metal oxide contact on p-type Si according to an embodiment of the present disclosure.

FIG. 4A shows linear I-V characteristics of metal oxide contact on p-type Si according to an embodiment of the present disclosure.

As shown in FIG. 4A, considering barrier formation in the energy band diagram, characterization of contacts of metal oxide is performed by forming contacts on p-type Si ($\rho$=9.77 $\Omega \cdot$cm and $N_p$=1.87'$10^{15}$ cm$^{-3}$, measured by the Hall effect).

Additionally, the linear I-V characteristics show no barrier between the contacting parts of p-type Si and metal oxide. Furthermore, it is shown that the work function of p-type Si is 4.91 eV ($\chi_{Si}$=4.05 eV, bandgap=1.12 eV, $E_{Fi}$-$E_F$=0.304 eV), and the work function of metal oxide is 4.9 eV or higher.

Accordingly, it can be seen that $MoO_2$ and $ReO_2$ all have much higher work function than p-type Si, and ohmic contacts are easily formed.

Figure 4B:
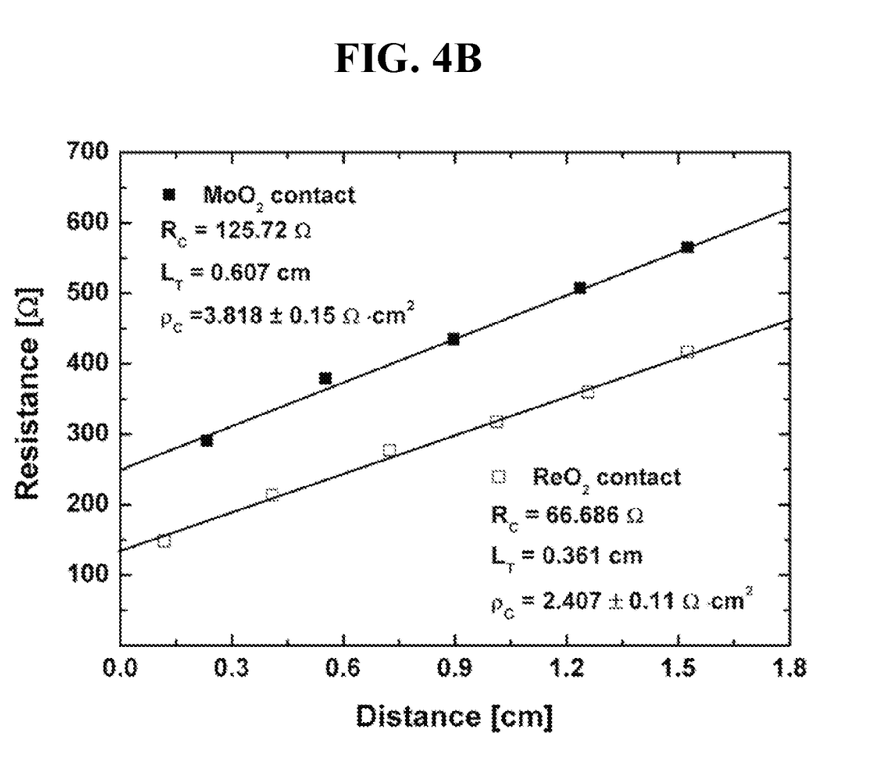
FIG. 4B shows specific contact resistance characteristics of metal oxide on p-type Si extracted by the TLM according to an embodiment of the present disclosure.

FIG. 4B shows specific contact resistance characteristics of metal oxide on p-type Si extracted by the transmission line method (TLM), according to an embodiment of the present disclosure.

As shown in FIG. 4B, the extracted specific contact resistance is 3.818±0.15 and 2.407±0.11 $\Omega \cdot$cm$^2$ in $MoO_2$ and $ReO_2$ respectively. It can be seen that the extracted specific contact resistance is higher than the contact resistance $10^{-3}$ $\Omega \cdot$cm$^2$) of Si—Al alloy on p-type Si formed by heat treatment at the melting temperature ($\geq$577° C.), but it cannot be directly compared with metal alloy contact due to a difference in specific resistance of metal oxide and the use of non-vacuum and non-thermal process in the operation.

Figure 5A:
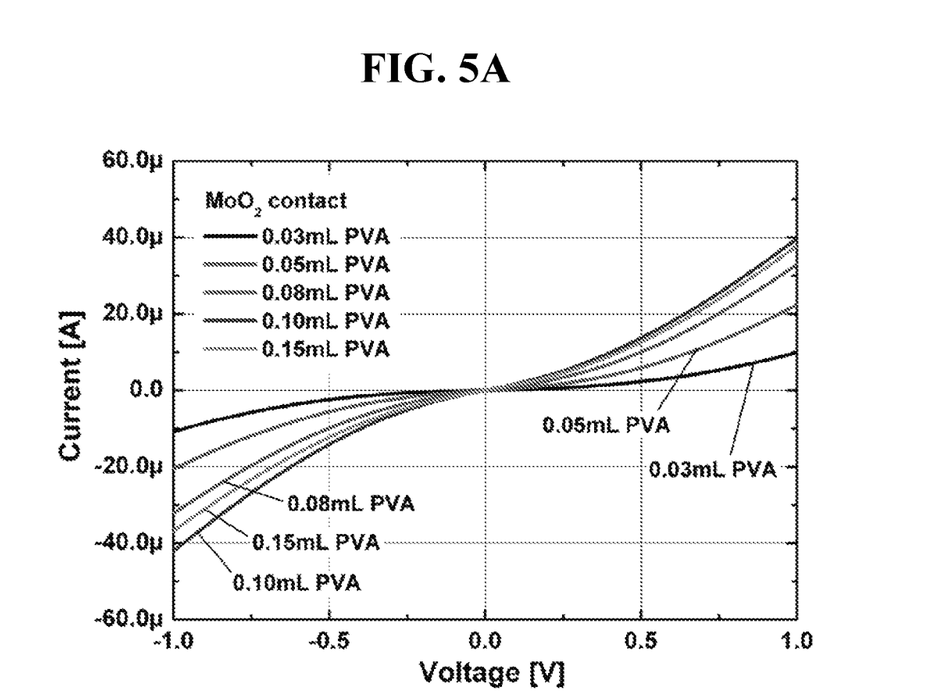
FIG. 5A shows I-V characteristics of a p-type GaN substrate with metal oxide $MoO_2$ ohmic contact as a function of PVA content according to an embodiment of the present disclosure.
Figure 5B:
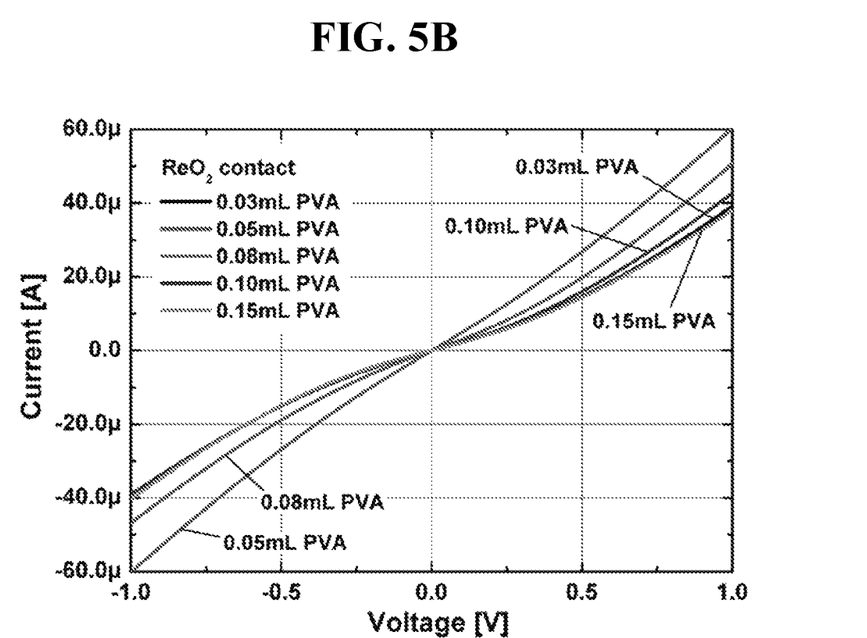
FIG. 5B shows I-V characteristics of a p-type GaN substrate with metal oxide $ReO_2$ ohmic contact as a function of PVA content according to an embodiment of the present disclosure.

FIGS. 5A and 5B each show I-V characteristics of a p-type GaN substrate with metal oxide $MoO_2$ and $ReO_2$ ohmic contact as a function of PVA content according to an embodiment of the present disclosure.

Specifically, a 1 μm-thick p-type GaN:Mg layer is grown on 2 μm undoped GaN deposited on a sapphire substrate. In this instance, the carrier concentration of the p-type GaN film measured by the Hall effect measurements is 1.47*$10^{16}$ cm$^{-3}$ ($\rho$=31.14 $\Omega \cdot$cm). Additionally, because GaN has a wide energy bandgap (~3.4 eV) and electron affinity (~4.1 eV), the work function of p-type GaN is a value obtained by subtracting an energy difference between Fermi level $E_F$ and valance band maximum $E_V$ ($N_V$=1.45'$10^{19}$ cm$^{-3}$) from the sum of the energy bandgap and the electron affinity.

Accordingly, p-type GaN has the work function of 7.3 eV, and metal for forming ohmic contact should have theoretically high work function.

Additionally, as shown in FIGS. 5A and 5B, it can be seen that the I-V curve is also influenced by the PVA content, and $ReO_2$ has better contact characteristics than $MoO_2$. This implies that $ReO_2$ has not only higher electrical conductivity but also higher work function than $MoO_2$.

Additionally, it can be seen from the linear I-V characteristics showing that in the case of $ReO_2$, the work function of $ReO_2$ is not high enough to remove barrier to the p-type GaN, but it is close to the work function of GaN and forms a very low barrier height.

Figure 6:
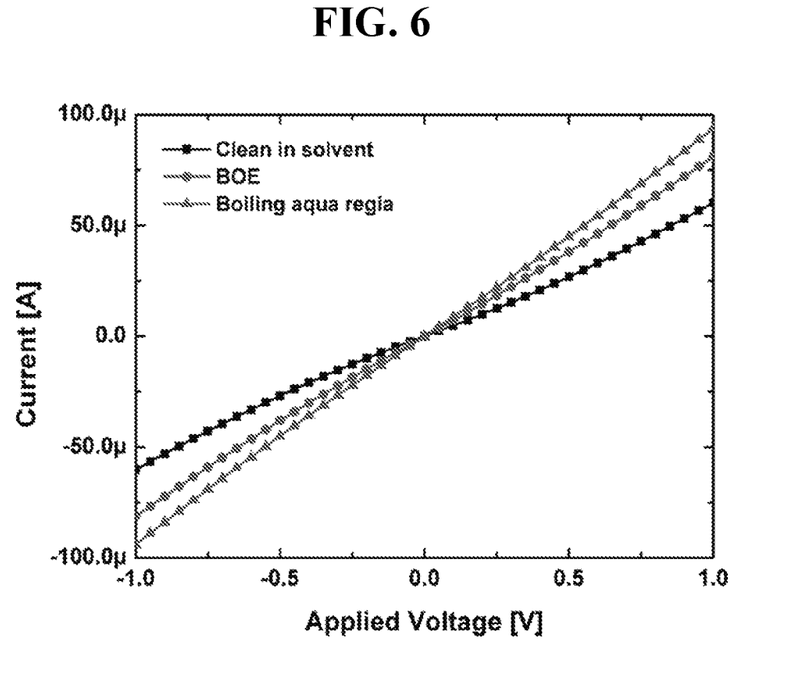
FIG. 6 shows I-V characteristics of $ReO_2$ contact on a p-type GaN substrate after surface treatment according to an embodiment of the present disclosure.

FIG. 6 shows I-V characteristics of $ReO_2$ contact on the p-type GaN substrate after surface treatment according to an embodiment of the present disclosure.

Surface oxide acts as a barrier against carrier transport, affecting the contact characteristics. Accordingly, many researchers have studied various surface treatment methods to reduce the barrier. In the present disclosure, boiling aqua regia of $HNO_3$:HCl=1:3 does not etch GaN, and effectively reduces the concentration of oxygen atoms on the surface.

Additionally, surface treatment is each performed using BOE and boiling aqua regia for 10 minutes and 20 minutes. This treatment effectively removes surface oxide and reduces the barrier, thereby obtaining excellent linear I-V characteristics (ohmic contact) using boiling aqua regia without vacuum and thermal process.

Particularly, oxide powder mixed with the binder used in the present disclosure is a metal oxide compound with high work function, and thus forms low metal semiconductor contact barriers when contacted with p-type semiconductor, facilitating the flow of carriers. Furthermore, without vacuum and thermal process, the process is made simpler and the cost savings are achieved.

Additionally, 5 wt % of polyvinylalcohol (PVA) as a binder is added to molybdenum and rhenium oxide powder with high work function to prepare a paste without vacuum process and thermal process, thereby overcoming the limitation in obtaining ohmic contacts because of higher work function of the p-type semiconductor materials than available contact metals on Earth.

Additionally, because ohmic characteristics are optimized with an addition of PVA in various amounts, it is possible to form ohmic contacts to p-type semiconductors using the $MoO_2$ and $ReO_2$ paste with high work function through non-vacuum and non-thermal process.

Those skilled in the art will appreciate that the present disclosure may be embodied in other specific forms without changing the technical spirit or essential features.

Therefore, it should be understood that the embodiments described hereinabove are for illustration only in all aspects, but not intended to limit the present disclosure to the above-described embodiments, and it should be interpreted that the scope of the present disclosure is defined by the appended claims rather than the above-described detailed description, and all modifications or variations derived from the meaning and scope of the appended claims and the equivalent concept are included in the scope of the present disclosure.

What is claimed is:

1. A method for forming an ohmic contact to a p-type semiconductor, comprising:
    applying a paste to a flexible GaN substrate,
    drying the paste on the flexible GaN substrate without a vacuum process or a thermal process, and
    performing a surface treatment of the flexible GaN substrate,
    wherein the paste comprises a metal oxide and a binder,
    wherein the metal oxide is a rhenium oxide or a molybdenum oxide, and
    wherein the binder is an inorganic or organic polymer compound.

2. The method of forming the ohmic contact to p-type semiconductor according to claim 1, wherein the metal oxide is rhenium oxide and wherein the rhenium oxide includes at least one selected from $Re_2O$, $Re_2O_3$, $ReO_2$, $ReO_3$ and $Re_2O_7$.

3. The method of forming the ohmic contact to p-type semiconductor according to claim 1, wherein the metal oxide is molybdenum oxide and wherein the molybdenum oxide includes at least one selected from $Mo_2O$, $Mo_2O_3$, $MoO_2$, $MoO_3$ and $Mo_2O_7$.

4. The method of forming the ohmic contact to p-type semiconductor according to claim 1, wherein the organic polymer compound is present and the organic polymer compound includes at least one selected from a vinyl-based polymer compound, a polyamide-based polymer compound and a polyurethane-based polymer compound.

5. The method of forming the ohmic contact to p-type semiconductor according to claim 4, wherein the vinyl-based polymer compound is present and the vinyl-based polymer compound is polyvinylalcohol.

6. The method of forming the ohmic contact to p-type semiconductor according to claim 5, wherein the polyvinylalcohol is present in an amount ranging between 0.03 and 0.15 mL.

7. The method of forming the ohmic contact to p-type semiconductor according to claim 1, wherein the rhenium oxide is present and includes $ReO_2$, and the binder includes 0.15 mL of polyvinylalcohol.

8. The method of forming the ohmic contact to p-type semiconductor according to claim 1, wherein the molybdenum oxide is present and includes $MoO_2$, and the binder includes 0.10 mL of polyvinylalcohol.

9. The method for forming ohmic contact to p-type semiconductor according to claim 1, wherein the performing surface treatment of the flexible GaN substrate comprises immersing in a solvent and boiling aqua regia.

10. The method for forming ohmic contact to p-type semiconductor according claim 5, wherein the polyvinylalcohol is present in an amount ranging between 0.05 milligrams to 0.25 milligrams, per milligram of the metal oxide.

\* \* \* \* \*